US007094702B2

(12) United States Patent
Yeom et al.

(10) Patent No.: US 7,094,702 B2
(45) Date of Patent: Aug. 22, 2006

(54) LAYER-BY-LAYER ETCHING APPARATUS USING NEUTRAL BEAM AND METHOD OF ETCHING USING THE SAME

(75) Inventors: Geun-young Yeom, Seoul (KR); Min-jae Chung, Bucheon (KR); Do-haing Lee, Suwon (KR); Sung-min Cho, Gunpo (KR); Sae-hoon Chung, Seoul (KR)

(73) Assignee: Sungkyunkwan University, Seoul (KR)

( * ) Notice: Subject to any disclaimer, the term of this patent is extended or adjusted under 35 U.S.C. 154(b) by 76 days.

(21) Appl. No.: 10/442,566

(22) Filed: May 21, 2003

(65) Prior Publication Data

US 2003/0209519 A1 Nov. 13, 2003

Related U.S. Application Data

(62) Division of application No. 10/086,497, filed on Feb. 28, 2002, now Pat. No. 6,874,443.

(51) Int. Cl.
*H01L 21/302* (2006.01)

(52) U.S. Cl. ...................... 438/709; 438/706; 438/708; 216/66

(58) Field of Classification Search .................. 216/58, 216/62, 65, 66; 438/706, 710, 720, 708, 438/709

See application file for complete search history.

(56) References Cited

U.S. PATENT DOCUMENTS

| | | | | | |
|---|---|---|---|---|---|
| 5,462,629 | A | * | 10/1995 | Kubota et al. | 156/345.55 |
| 5,540,812 | A | * | 7/1996 | Kadomura | 438/710 |
| 6,017,826 | A | * | 1/2000 | Zhou et al. | 438/720 |
| 6,025,115 | A | * | 2/2000 | Komatsu et al. | 430/313 |
| 6,162,733 | A | * | 12/2000 | Obeng | 438/706 |

OTHER PUBLICATIONS

U.S. Appl. No. 10/086,497, filed Feb. 28, 2002, Yeom et al.

* cited by examiner

*Primary Examiner*—Lan Vinh
(74) *Attorney, Agent, or Firm*—Foley & Lardner LLP

(57) ABSTRACT

A layer-by-layer etching apparatus and an etching method using a neutral beam which enables to control etching depth to an atomic level by controlling the etching of each atom of a material layer to be etched under precise control of the supply of an etching gas and irradiation of the neutral beam and enables to minimize etching damage. In the layer-by-layer etching method, a substrate to be etched, on which a layer to be etched is exposed, is loaded on a stage in a reaction chamber. An etching gas is supplied into the reaction chamber to adsorb the etching gas on the surface of an exposed portion of the layer to be etched. Excessive etching gas remaining after being adsorbed is removed. A neutral beam is irradiated on the layer to be etched on which the etching gas is adsorbed. Etch by-products generated by the irradiation of the neutral beam is removed.

11 Claims, 6 Drawing Sheets

LAYER-BY-LAYER ETCHING APPARATUS USING NEUTRAL BEAM AND METHOD OF ETCHING USING THE SAME

CROSS REFERENCE TO RELATED APPLICATIONS

This application is a divisional application of U.S. patent application Ser. No. 10/086,497, filed on Feb. 28, 2002, now U.S. Pat. No. 6,874,443 which is herein incorporated by reference in its entirety.

BACKGROUND OF THE INVENTION

1. Field of the Invention

The present invention relates to a layer-by-layer etching apparatus using a neutral beam and an etching method using the same, and more particularly, to an etching apparatus having a neutral beam generator for easily generating a neutral beam and a layer-by-layer etching method using a neutral beam which enables to attain the precise control of etching depth and minimization of etching damage by etching layers to be etched in a layer-by-layer manner under proper control of acceleration energy of the neutral beam.

2. Description of the Related Art

As an increase in the integration density of semiconductor devices has been required, the design rule of integrated semiconductor circuits has been reduced. Thus, a critical dimension of 0.25 μm or less is needed. Ion enhanced etching tools, such as a high density plasma etcher and a reactive ion etcher are mainly used as etching tools for realizing nanoscale semiconductor devices. In such case, high density ions having energies of a few hundred eV bombard a semiconductor substrate or a specific material layer on the semiconductor substrate for anisotropic etching. The bombardment of such ions causes physical and electrical damages to the semiconductor substrate or the specific material layer.

Examples of physical damage are as follows. A substrate or a specific material layer having crystallinity is transformed into an amorphous layer. Also, a specific material layer, on which some incident ions are adsorbed or bombarded, of which partial components are only selectively desorbed therefrom to change chemical composition of a surface layer to be etched. Atomic bonds of the surface layer are changed into dangling bonds by this bombardment. Dangling bonds may result in electrical damage as well as physical damage. As electrical damage, there is gate dielectric charge-up or polysilicon notching due to photoresist charging. Besides this physical and electrical damages, there is also possible contamination by materials of a chamber or the contamination of a surface layer by a reactive gas such as the generation of C-F polymers caused by the use of a CF-based gas.

Physical and electrical damages due to the bombardment of ions reduces the reliability of nanoscale semiconductor devices and productivity. New apparatuses and methods for etching semiconductor devices are required to be developed in order to cope with the trend toward further increases in the integration density of semiconductor devices and reductions in design rule due to increased integration density.

An argon ion beam was conventionally used to etch an oxide, a nitride, and a carbide having excellent anticorrosion or in processing a thin film to an accurate and precise etching depth. In particular, the argon ion beam was necessary for a copper-based oxide reactive to a solution or the etching of ceramic thin films strongly resistive to acid.

However, the state of the argon ion beam may greatly vary depending on degree of vacuum in a vacuum apparatus and kinds of materials to be etched as well as voltage, current, and flow rate of argon gas controlled by an ion beam power supply. Thus, it is very difficult to repeatedly form an ion beam and the state of the ion beam continuously varies during its use. As a result, it is very difficult to repeatedly form etch patterns having a desired etch depth.

Also, a conventional ion beam etcher irradiates an etching gas and an ion beam or plasma at the same time on a material to be etched such as a silicon substrate such that it is difficult to precisely control the depth to be etched to an atomic level.

Thus, an etching apparatus and an etching method which are capable of reducing damage to a material layer to be etched by an ion beam under precise control of etching depth should be studied.

SUMMARY OF THE INVENTION

To solve the above-described problems, it is an objective of the present invention to provide a layer-by-layer etching apparatus and an etching method using a neutral beam which enables to control etching depth to an atomic level by controlling the etching of each atom of a material layer to be etched under precise control of the supply of an etching gas and irradiation of the neutral beam and enables to minimize etching damage.

Accordingly, to achieve the above objective, there is provided a layer-by-layer etching apparatus using a neutral beam. The layer-by-layer etching apparatus includes: a reaction chamber having a stage therein on which a substrate to be etched is mounted; a neutral beam generator for generating a neutral beam from a source gas to supply the neutral beam into the reaction chamber; a shutter installed between the neutral beam generator and the reaction chamber, the shutter for controlling the supply of the neutral beam into the reaction chamber; an etching gas supply for supplying an etching gas into the reaction chamber; a purge gas supply for supplying a purge gas into the reaction chamber; and a controller for controlling the supply of the source gas, the etching gas, and the purge gas and the opening and closing of the shutter.

The neutral beam generator may be generally-known neutral beam generators. Also, the neutral beam generator includes an ion source for extracting an ion beam having a predetermined polarity from the source gas and accelerating the ion beam, and a reflector positioned in the path of an ion beam accelerated from the ion source, the reflector for reflecting and neutralizing the ion beam. Preferably, the reflector may be formed of a plate which may be tilted to control an angle of incidence of an incident ion beam to the horizontal surface of the plate, or may be formed of a plurality of overlapped cylindrical reflectors and different polar voltages are applied to adjacent reflectors of the overlapped cylindrical reflectors. The reflector may be a semiconductor substrate, a silicon dioxide, or a metal substrate. The ion source may be a high-density helicon plasma ion gun or an ICP-type ion gun.

The substrate to be etched may be a substrate containing silicon, the neutral beam may be an argon neutral beam, and the etching gas may be a chlorine gas. However, the kind of the etching gas or the neutral beam may be various depending on the kind of a material layer of the substrate to be etched.

To achieve the above objective, there is provided a layer-by-layer etching method using a neutral beam. The layer-by-layer etching method includes: (a) loading a substrate to be etched, on which a layer to be etched is exposed, on a stage in a reaction chamber; (b) supplying an etching gas into the reaction chamber to adsorb the etching gas on the surface of an exposed portion of the layer to be etched; (c) removing excessive etching gas remaining after being adsorbed; (d) irradiating a neutral beam on the layer to be etched on which the etching gas is adsorbed; and (e) removing etch by-products generated by the irradiation of the neutral beam.

The steps (b) through (e) forms one cycle which is repeatedly performed to etch the layer to be etched from the surface of the layer in a layer-by-layer manner. The supply amount of the etching gas, the time required for supplying the etching gas, and the time required for irradiating the neutral beam are controlled to etch a monoatomic layer distributed on the surface of the layer to be etched by half whenever the cycle is performed one time.

In step (d), acceleration energy of the neutral beam is controlled so that sputtering does not occur on the surface of the layer to be etched. Preferably, the acceleration energy of the neutral beam is controlled to be 50 eV or less to control the etching depth of the layer to be etched and minimize damage to the layer to be etched.

The layer to be etched may be a material layer containing silicon, e.g., silicon single crystal, polysilicon, or a silicon compound, the etching gas may be a chlorine gas, and the neutral beam may be a neutral beam containing various atoms, e.g., an argon neutral beam.

The steps (c) and (e) may be performed using an inactive gas, e.g., a nitrogen gas, as a purge gas.

In step (d), various types of neutral beam generators may be used. For example, the neutral beam is irradiated from an ion source for extracting an ion beam having a predetermined polarity from a source gas and accelerating the ion beam and a neutral beam generator having a reflector which is positioned in a path of the ion beam accelerated from the ion source and reflects and neutralizes the ion beam. A shutter, which installed between the neutral beam generator and the reaction chamber, may control the irradiation of the neutral beam.

According to the present invention, a neutral beam is used instead of an ion beam to etch a substrate to be etched. Thus, damage to the surface of the substrate can remarkably be reduced. Also, a material layer to be etched is etched under precise control of the supply of an etching gas and the irradiation of the neutral beam. Thus, etching depth can very precisely be controlled to an atomic level.

BRIEF DESCRIPTION OF THE DRAWINGS

The above objective and advantages of the present invention will become more apparent by describing in detail preferred embodiments thereof with reference to the attached drawings in which.

DETAILED DESCRIPTION OF THE INVENTION

Hereinafter, preferred embodiments of the present invention will be described in detail with reference to the attached drawings. However, the embodiments of the present invention can be modified into various other forms, and the scope of the present invention must not be interpreted as being restricted to the embodiments. The embodiments are provided to more completely explain the present invention to those skilled in the art.

Figure 1:
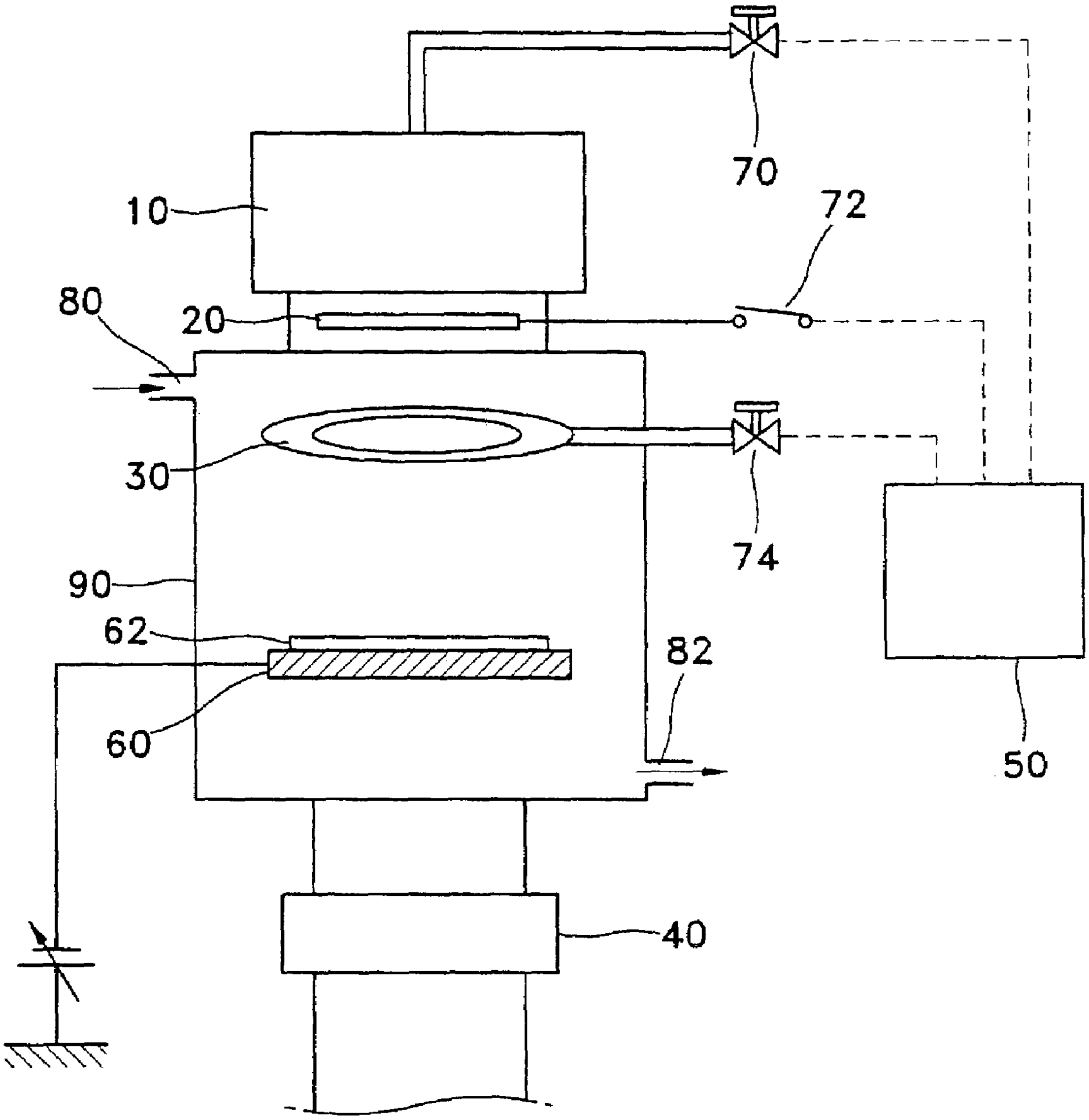
FIG. 1 is a schematic view of a layer-by-layer etching apparatus using a neutral beam according to an embodiment of the present invention.

FIG. 1 is a schematic view of a neutral beam etching apparatus according to an embodiment of the present invention. Referring to FIG. 1, a reaction chamber 90, in which an etching process is performed, includes a stage 60 on which a substrate 62 to be etched is placed. A material layer to be etched is formed on the substrate 62. The stage 60 is grounded. A neutral beam generator 10 is prepared over the reaction chamber 90. A shutter 20, which is automatically opened and closed, is installed between the reaction chamber 90 and the neutral beam generator 10. An etching gas supply 30, which is a shower ring for supplying an etching gas, is installed over the stage 60. A purge gas supply inlet 80 for supplying a purge gas is installed on an upper sidewall of the reaction chamber 90. A purge gas discharging outlet 82 for discharging the purge gas, an excessive etching gas, or etching by-products is installed on a lower sidewall of the reaction chamber 90. A discharging pump 40 for maintaining pressure in the reaction chamber 90 in high vacuum, e.g., a turbo molecular pump, is installed under the reaction chamber 90.

A source gas supply pipe for supplying a source gas is coupled to the neutral beam generator 10. A source gas supply valve 70 for controlling the supply of a source gas is installed at the source gas supply pipe. An etching gas supply pipe for supplying an etching gas is coupled to the etching gas supply 30. An etching gas supply valve 74 for controlling the supply of an etching gas is installed at the etching gas supply pipe. A shutter switch 72 for controlling the opening and closing of the shutter 20 is installed at the shutter 20. A controller 50 controls the supply amount and time of the source gas supply valve 70 and the etching gas supply valve 74 and the opening and closing time of the shutter switch 72.

Figure 5:
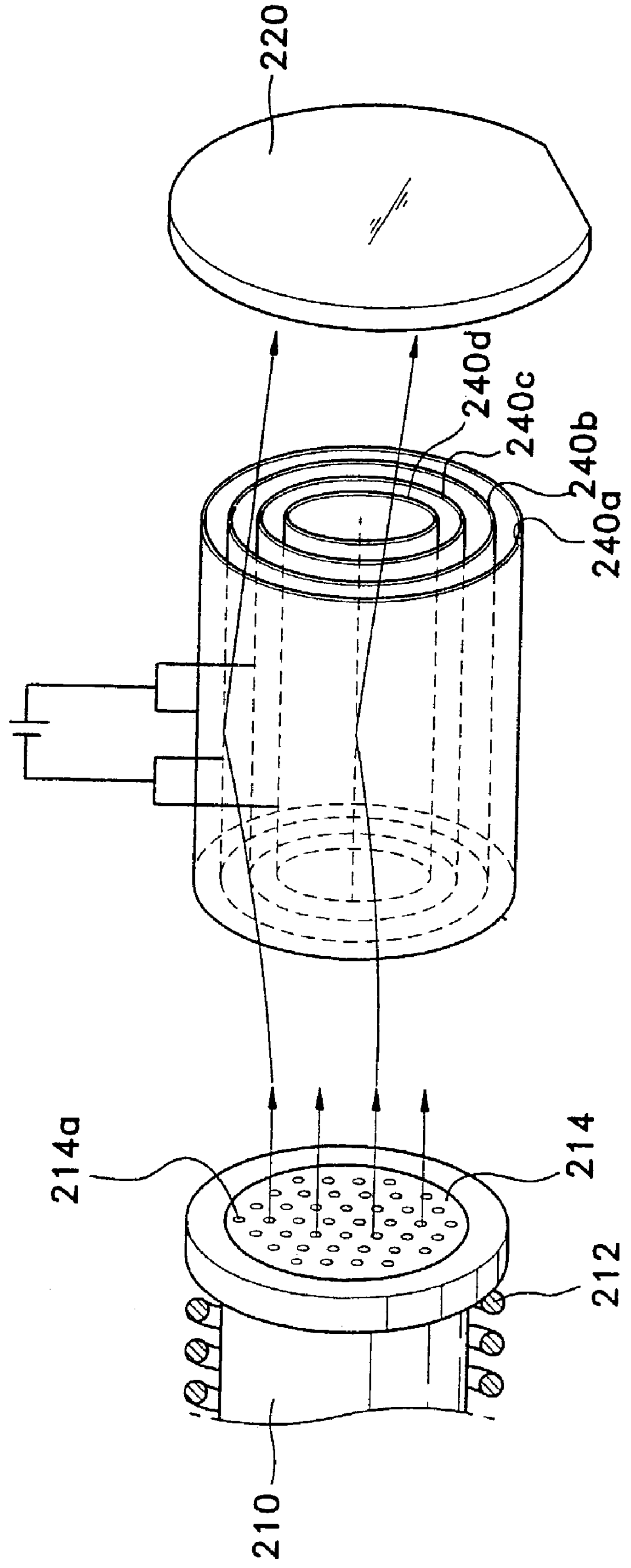
FIG. 5 is a schematic view of a neutral beam generator of an etching apparatus according to another embodiment of the present invention.

The neutral beam generator using in the present invention can be applied to known various neutral beam generators. FIG. 5 is a schematic view of a neutral beam generator of an etching apparatus explaining the principle of generating a neutral beam according to the embodiment of the present invention. Some of the inventors of this application disclosed the neutral beam generator in Korea Application No. 00-69660 filed on Nov. 22, 2000, which is incorporated herein as reference.

In the principle of generating a neutral beam according to the present invention, an ion beam having a predetermined polarity is extracted from an ion source and accelerated. An accelerated ion beam is reflected on a reflector and neutralized into a neutral beam. A substrate to be etched is placed in the path of the neutral beam to etch a specific material layer on the substrate to be etched by the neutral beam.

Theoretical mechanism of the reflection of the accelerated ion beam by the reflector and then the transformation of the reflected ion beam into the neutral beam is based on a thesis "Molecular dynamics simulations of $Cl_2^+$ impacts onto a chlorinated silicon surface: Energies and angles of the reflected $Cl_2$ and Cl fragments" (J. Vac. Sci. Technol. A 17(5), September/October 1999) by B. A. Helmer and D. B. Graves. According to this thesis, when $Cl_2^+$ ions are incident on a silicon substrate having a chloride (Cl) monolayer at an angle higher than a critical incidence angle, the $Cl_2^+$ ions may be neutralized. Also, the distribution of reflected neutral $Cl_2$ molecules and Cl atomic fragments to $Cl_2$ molecules incident at the angle of incidence of 85° is represented as a polar angle and an azimuthal angle, respectively. This thesis shows that nearly 90% or more of ions that are incident at an angle within a predetermined range are reflected as neutral atoms or neutral molecules and the azimuthal angle of the reflected particles is close to 0°.

Figure 4:
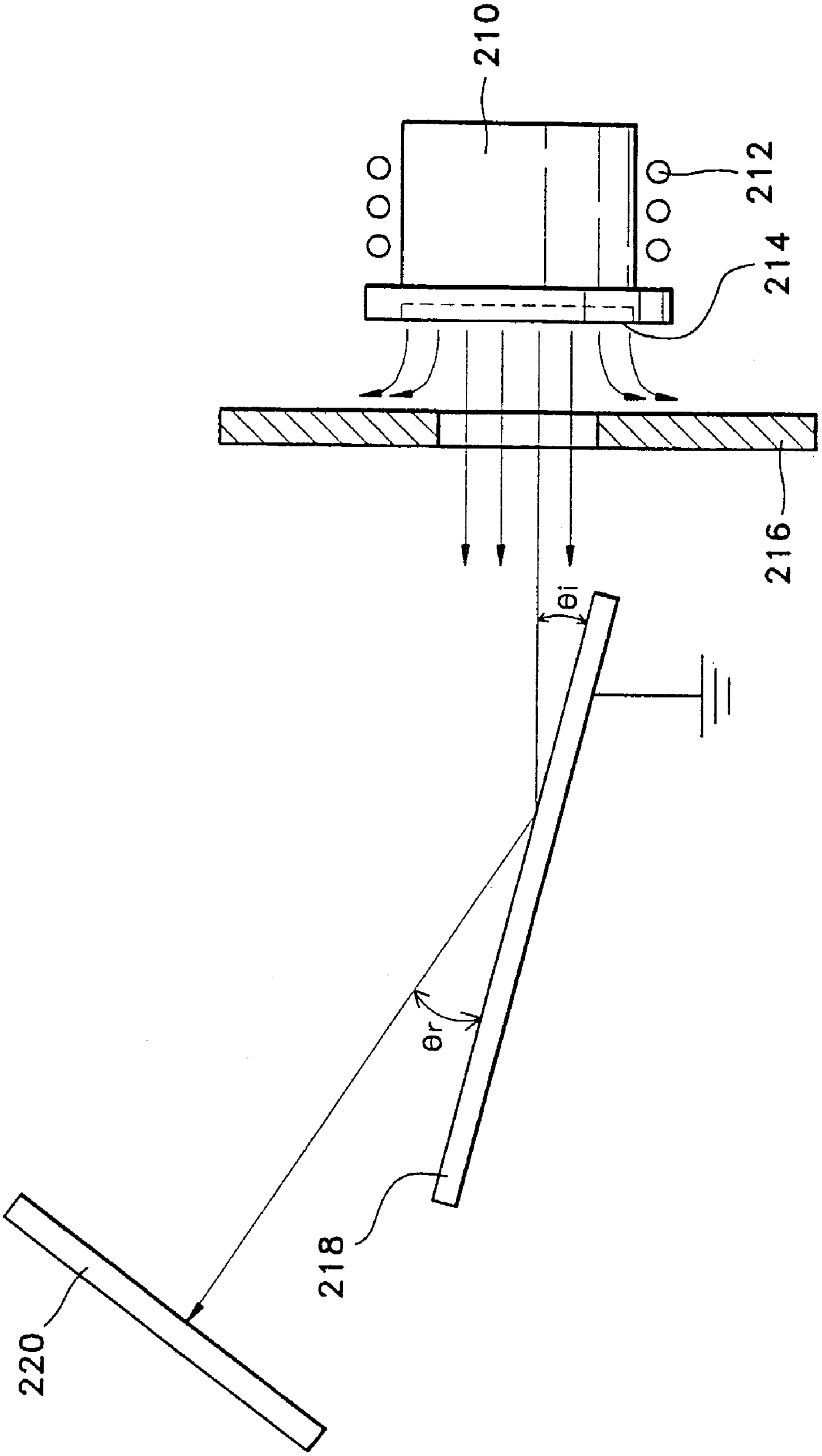
FIG. 4 is a schematic view of a neutral beam generator of an etching apparatus according to the embodiment of the present invention.

Referring to FIG. 4, an ion beam generated from an ion source 210 passes through an ion beam blocker 216 a slit with a predetermined diameter, in front of the ion source 210, is reflected on a reflector 218, neutralized, and incident on a substrate 220 to be etched to etch a specific material layer on the substrate 220. The ion source 220 may generate an ion beam from various reaction gases and is inductively coupled plasma (ICP) generator for applying induced power to an induction coil 212 to generate plasma in this embodiment. The ion source 220 may be various types such as a high-density helicon plasma generator. A grid 214, which has a plurality of holes for accelerating an ion beam by the application of a voltage and passing ions of the ion beam, is formed at an end of the ion source 210.

An ion beam blocker 216 having a slit with a circular or rectangular hole of a predetermined diameter at the center thereof is disposed at the rear of the ion source 210. The ion beam blocker 216 passes ions that have a predetermined direction and are within a predetermined range of ion beams accelerated by the ion source 210 and blocks other ions from entering chamber to prevent contamination caused by the bombardment of unnecessary ions on the inner wall of the chamber or components of the chamber. Also it prevents the neutral beam reflected on the reflector 218 from being bombarding unnecessary ions and then dispersing, which may inhibit an anisotropic etching process with the neutral beam.

A reflector 218 is slanted to at a proper angel with a level surface to reflect ions that passed through the slit before ion beam blocker 216. Here, the reflector 218 is shown as a single plate, but a plurality of reflectors 218 spaced apart from each other and having the same angles may be formed as one. The reflector 218 can be tilted so that the gradient of the reflector 218 is adjusted within an appropriate range, and is preferably grounded to discharge charges generated by an incident ion beam. The reflector 218 may have various shapes such as rectangular or circular shapes and be made of a silicon semiconductor substrate, a substrate having silicon oxide thereon, or a metal substrate.

The gradient and size of the reflector 218 is adjusted according to the size of the slit formed at the ion beam blocker 216. In other words, the ion beam passed through the slit has a projected area that is entirely within the reflector 218 so that all of the ions of the ion beam passed through the slit is reflected by the reflector 218. In this embodiment, the gradient of the reflector 218 may be adjusted within a range of 5–15° with respect to the level surface. The gradient of the reflector 218 is nearly equal to an angle θi of incidence and an angle θr of reflection with respect to the level surface, as shown in FIG. 4. Thus, the gradient of at least 5–15° to the level surface means the angle of incidence to the vertical line with respect to the surface of the reflector 218 is at least 75–85°.

A substrate 220 to be etched is disposed in the path of the ion beam neutralized due to the reflection by the reflector 218. The substrate 220 to be etched may be mounted on a stage (not shown) to be disposed in a vertical direction with respect to the path of the neutral beam. The direction and position of substrate 220 to be etched may be adjusted and slanted at a predetermined angle depending on the kind of etching process. A retarding grid (not shown) for controlling acceleration energy of a neutral beam may be installed between the reflector 218 and the substrate 220 to be etched. FIG. 4 is a schematic view explaining the principle of generating a neutral beam generator, but a shutter for controlling the supply of a neutral beam is further installed before the substrate 220 to be etched in the path of the neutral beam compared to FIG. 1.

FIG. 5 is a schematic view of a neutral beam generator of an etching apparatus according to another embodiment of the present invention. FIG. 5 is a simple view explaining the principle of the present invention like FIG. 4. An etching method according to this embodiment is similar to the embodiment described with reference to FIG. 4 except for the shape of a reflector and a method of reflecting an ion beam. In other words, the etching method according to this embodiment, an ion beam having a predetermined polarity is extracted from an ion source and accelerated. Next, the accelerated ion beam is reflected on a plurality of cylindrical reflectors, which are adjacent to each other and to which voltages having different polarities are applied, to be neutralized into a neutral beam. A substrate to be etched is positioned in the path of the neutral beam to etch a specific material layer on the substrate to be etched by the neutral beam. Like reference numerals in FIG. 4 denote the same members and the detailed descriptions thereof are omitted.

Referring to FIG. 5, an ion beam is extracted from an ion source 210. The ion beam is reflected by a plurality of cylindrical reflectors which are positioned at the rear of the ion source 210 in the path of the ion beam. A reflected beam is neutralized into a neutral beam. The neutral beam is incident on a substrate 220 to be etched in order to etch a specific material layer on the substrate 220. It is not shown in FIG. 5, an ion beam blocker 216 having a slit of a predetermined diameter may be placed at the rear of the ion source 210.

A voltage of ion source 210 may be applied to the end of the ion source 210 to accelerate the ion beam. A grid 214 having a plurality of holes 214*a* through which ion beams pass may be formed.

In this embodiment, a plurality of cylindrical reflectors 240*a*, 240*b*, 240*c*, and 240*d* which overlap radially are included between the ion source 210 and the substrate 210. Adjacent reflectors of the plurality of cylindrical reflectors 240*a*, 240*b*, 240*c*, and 240*d* have different polar voltages. Thus, ions having a predetermined polarity are repulsed from reflectors having the same polarity as said ions when the ion beam passes through the cylindrical reflectors 240*a*, 240*b*, 240*c*, and 240*d*. In contrast, the ions are attracted to reflectors having a different polarity from said ions, so said ions are reflected by such reflectors. The reflected ion beam passes through the cylindrical reflectors 240*a*, 240*b*, 240*c*, and 240*d* to perform an etching process on the substrate 220. The lengths, radii, and voltages of the cylindrical reflectors 240*a*, 240*b*, 240*c*, and 240*d* may be adjusted according to design. The cylindrical reflectors 240*a*, 240*b*, 240*c*, and

240*d* may be formed of the same material as the reflector in the embodiment described with reference to FIG. 4, preferably, a conductive material.

In the present embodiment, the cylindrical reflectors may be slanted so that they are tilted within a physical range. Preferably, the strengths of the voltages applied to the cylindrical reflectors can be controlled. In other words, the trajectory of the ion beam can be controlled by controlling the mass, speed, and the angle of incidence of the incident ion beam and the magnitude of electromagnetic fields in the cylindrical reflectors. The incident ion beam traveling in a parabolic path bombard the surfaces of the cylindrical reflectors and then are transformed into a neutral beam. The neutral beam moves in a straight line. Here, the angle of incidence of the ion beam to the longitudinal axis of the cylindrical reflectors may be adjusted within the range of at least 5-15°. In this embodiment, a retarding grid may further be installed at the rear of the cylindrical reflectors and a shutter is installed before the substrate 220 compared to the embodiment described with reference to FIG. 1.

Hereinafter, a layer-by-layer etching method using a neutral beam according to the embodiment of the present invention will be described in detail with reference to FIGS. 2A through 2E.

Figure 2A:
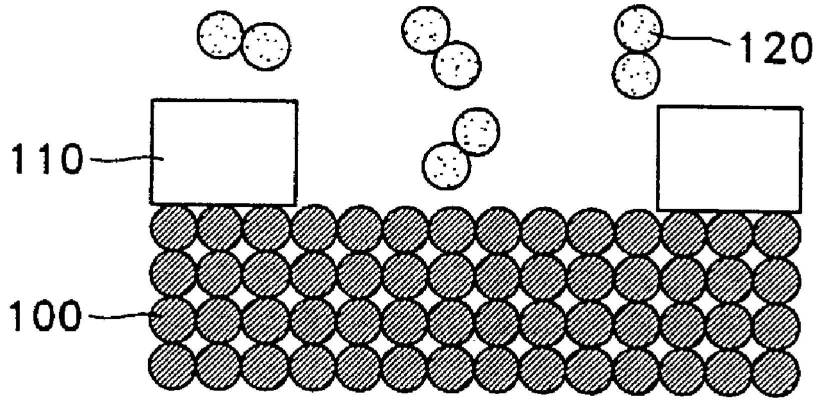
FIGS. 2A through 2E are cross-sectional views explaining a mechanism of a layer-by-layer etching method according to the embodiment of the present invention.

Referring to FIG. 2A, a portion of the surface of a material layer 100 to be etched is not covered with an etch mask 10 and the exposed portion is supplied with an etching gas 120. The material layer 100 may be a semiconductor substrate containing at least silicon including silicon single crystal or polysilicon or what the material layer 100 is formed on the surface of the semiconductor substrate to a predetermined thickness. The etch mask 110 may be photoresist but not limited to this. In other words, a material on which the etching gas 120 is not adsorbed is sufficient for the etch mask 110. The etch mask 110 may be formed by general photolithography. The etching gas 120 depends on the kinds of the material layer 100 to be etched. However, in this embodiment, the etching gas 120 is Cl gas which is easily adsorbed on the material layer 100 to be etched containing silicon. In this embodiment, Cl gas of about 0.5 sccm is supplied.

The supply of an etching gas is described with reference to FIG. 1. The controller 50 switches off the shutter switch 72 to close the shutter 20 and intercept a neutral beam supplied from the neutral beam generator 10. The controller 50 opens the etching gas valve 74 so that the etching gas 120 flows from a supply source of an etching gas (not shown) via the etching gas supply 30, which is the shower ring, into the reaction chamber 90 for a predetermined time. Then, Cl gas molecules, which are the etching gas 120, are adsorbed on the surface of the material layer 100 to be etched as a monolayer. Silicon atoms and Cl gas atoms are simplified to the same size in the FIGS. 2A through 2E, and a silicon atom and a Cl gas molecule are combined, reacted into $SiCl_2$, and adsorbed. The etching gas supply valve 74 preferably controls so that Cl gas flow into the reaction chamber 90 for 1-40 seconds. Here, base pressure in the reaction chamber 90 is maintained to about $2\times10^{-6}$ torr.

Figure 2B:
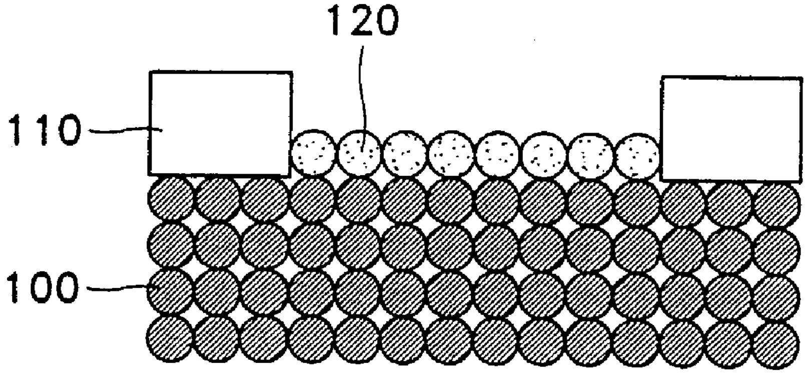

Referring to FIG. 2B, the etching gas 120 is adsorbed as a monolayer on the surface of the material layer 100 to be etched. Excess etching gas 120 which is not adsorbed is removed using a purge gas. The purge gas is an inactive gas, e.g., a nitrogen gas. In FIG. 1, the etching gas supply valve 74 is closed to stop the supply of the etching gas 120. Next, the purge gas is supplied through the purge gas supply inlet 80. The purge gas is discharged with the excess etching gas 120 through the purge gas discharging outlet 82.

Figure 2C:
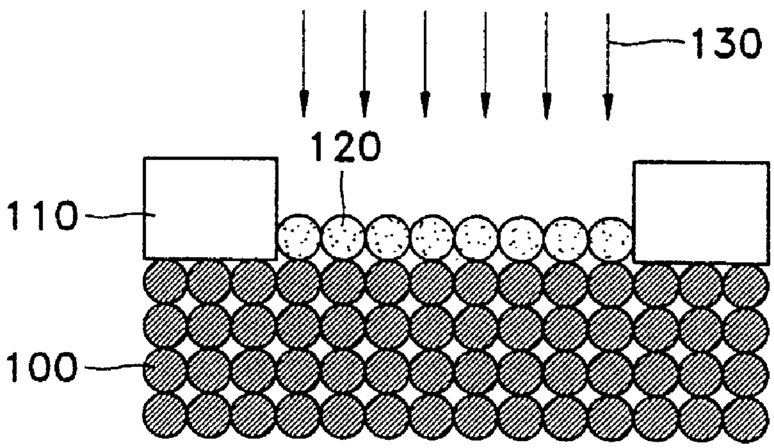

FIG. 2C is a cross-sectional view showing steps of irradiating a neutral beam 130. An argon neutral beam is used in this embodiment. In FIG. 1, the shutter 20 is opened to irradiate the neutral beam 130 on the $SiCl_2$ monolayer, which is reacted with the surface of the material layer 100 to be etched and adsorbed, for a short time, e.g., within several seconds. Here, acceleration energy of the neutral beam 130 is controlled to about 50 eV or less so that sputtering does not occur on the surface of the material layer 100 to be etched.

Figure 2D:
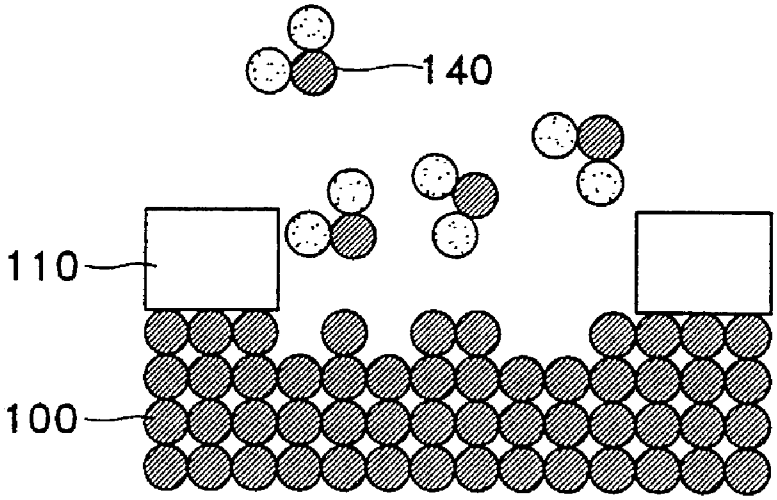

Referring to FIG. 2D, $SiCl_2$, which is etch by-products adsorbed on the surface of the material layer 100 to be etched, is desorbed and etched due to the irradiation of a neutral beam. It is preferable that pressure is maintained to about $4\times10^{-4}$ torr during the etching. The etch by-products may be removed with a purge gas as described previously or may be discharged through the purge gas discharging outlet 82 after a predetermined time after the supply of the neutral beam stops.

The steps described with reference to FIGS. 2A through 2E becomes one cycle of the etching method of the present invention. Since $SiCl_2$ is formed by the combination of a silicon atom and two Cl gas atoms, the surface of a material layer to be etched is about half etched for one cycle. The etch depth of the surface of the material layer to be etched for one cycle is about 0.68 μm, i.e., half a silicon monolayer.

Figure 2E:
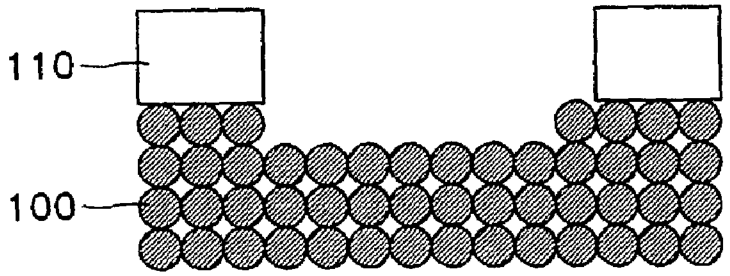

Referring to FIG. 2E, a monolayer of the material layer to be etched is removed after an etching process of one cycle is repeated.

Figure 3:
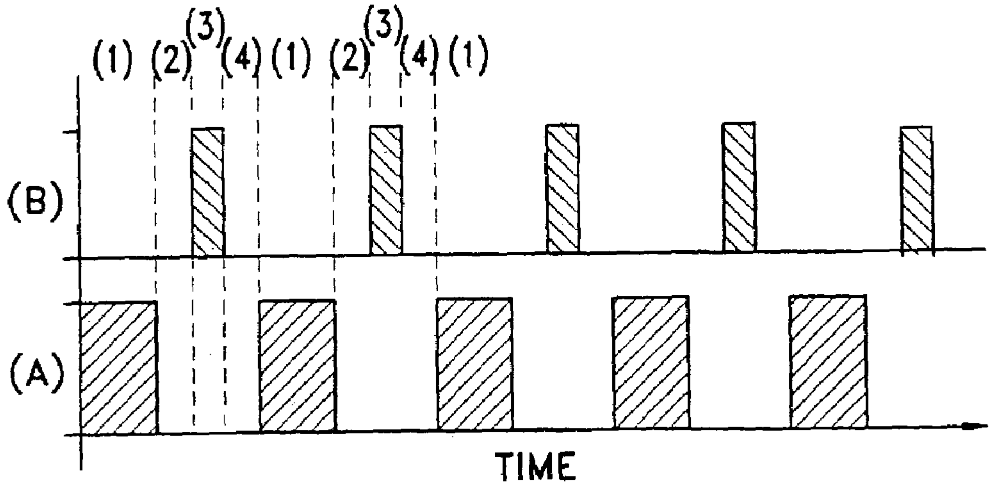
FIG. 3 is a time chart of the layer-by-layer etching method according to the embodiment of the present invention.

FIG. 3 is a time chart of a layer-by-layer etching method according to the embodiment of the present invention. In FIG. 3, a horizontal axis represents time passage, "(A)" represents the time required for supplying an etching gas, and "(B)" represents the time required for opening a shutter.

Referring to FIG. 3, one cycle of an etching process of the present invention is the following 4 steps: (1) the supply of an etching gas; (2) the purge of excess etching gas; (3) the irradiation of a neutral beam after opening a shutter; (4) the removal of reactive by-produces. The cycle is repeated to etch a material layer to be etched in a layer-by-layer manner.

While this invention has been particularly shown and described with reference to preferred embodiments thereof, it will be understood by those skilled in the art that various changes in form and details may be made therein without departing from the spirit and scope of the invention as defined by the appended claims. In particular, a neutral beam generator of the present invention may have various shapes and an etching gas and a source gas of a neutral beam may variously be selected depending on a material layer to be etched. Also, it is apparent to control the time required for each step of one cycle of an etching process of the present invention.

According to the present invention, an etching process is performed using a neutral beam instead of an ion beam. Thus, there is an effect of minimizing electrical and physical damage to a substrate to be etched.

Moreover, the supply of an etching gas and the time required for irradiating a neutral beam is precisely controlled to perform the etching process an atom level. Thus, it is very easy to control etch depth.

What is claimed is:

1. A layer-by-layer etching method using a neutral beam, comprising:

(a) loading a substrate to be etched, on which a layer to be etched is exposed, on a stage in a reaction chamber;

(b) supplying an etching gas into the reaction chamber to adsorb the etching gas on a surface of an exposed portion of the layer to be etched; and (c) irradiating a neutral beam after supplying the etching gas, the neutral beam comprising particles which have been neutralized from an ion beam, on the layer to be etched on which the etching gas is adsorbed.

2. The layer-by-layer etching method of claim 1, wherein steps (b) and (c) form one cycle which is repeatedly performed to etch the layer to be etched from the surface of the layer in a layer-by-layer manner.

3. The layer-by-layer etching method of claim 2, wherein a monoatomic layer distributed on the surface of the layer to be etched is etched by half whenever the cycle is performed one time.

4. A layer-by-layer etching method using a neutral beam, comprising:

(a) loading a substrate to be etched, on which a layer to be etched is exposed, on a stage in a reaction chamber;

(b) supplying an etching gas into the reaction chamber to adsorb the etching gas on a surface of an exposed portion of the layer to be etched; and (c) irradiating a neutral beam, after supplying the etching gas, on the layer to be etched on which the etching gas is adsorbed, wherein in step (c) acceleration energy of the neutral beam is controlled so that sputtering does not occur on the surface of the layer to be etched.

5. The layer-by-layer etching method of claim 4, wherein the acceleration energy of the neutral beam is controlled to be 50 eV or less.

6. The layer-by-layer etching method of claim 1, wherein the layer to be etched is a material layer containing silicon, the etching gas is a chlorine gas, and the neutral beam is an argon neutral beam.

7. The layer-by-layer etching method of claim 1, further comprising removing excessive etching gas remaining before the step (c).

8. The layer-by-layer etching method of claim 1, wherein in step (c), the neutral beam is irradiated from an ion source for extracting an ion beam having a predetermined polarity from a source gas and accelerating the ion beam and a neutral beam generator having a reflector which is positioned in a path of the ion beam accelerated from the ion source and reflects and neutralizes the ion beam.

9. The layer-by-layer etching method of claim 1, further comprising removing etch by-products generated by the irradiation of the neutral beam after the step (c).

10. The layer-by-layer etching method of claim 7, wherein the removing excessive etching gas comprises supplying a nitrogen gas as a purge gas to the reaction chamber.

11. The layer-by-layer etching method of claim 9, wherein the removing etch by-products comprises supplying a nitrogen gas as a purge gas to the reaction chamber.

* * * * *